(12) United States Patent
Wathuthanthri et al.

(10) Patent No.: US 11,342,440 B2
(45) Date of Patent: May 24, 2022

(54) PASSIVATED TRANSISTORS

(71) Applicants: Ishan Wathuthanthri, Baltimore, MD (US); Ken Alfred Nagamatsu, Ellicott City, MD (US); William J. Sweet, Baltimore, MD (US); James T. Kelliher, Elkridge, MD (US); John S. Mason, Jr., Pasadena, MD (US); Jonah Paul Sengupta, Baltimore, MD (US)

(72) Inventors: Ishan Wathuthanthri, Baltimore, MD (US); Ken Alfred Nagamatsu, Ellicott City, MD (US); William J. Sweet, Baltimore, MD (US); James T. Kelliher, Elkridge, MD (US); John S. Mason, Jr., Pasadena, MD (US); Jonah Paul Sengupta, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 182 days.

(21) Appl. No.: 16/518,381

(22) Filed: Jul. 22, 2019

(65) Prior Publication Data
US 2021/0028295 A1  Jan. 28, 2021

(51) Int. Cl.
*H01L 29/778* (2006.01)
*H01L 29/15* (2006.01)
(Continued)

(52) U.S. Cl.
CPC ........ *H01L 29/66462* (2013.01); *H01L 21/56* (2013.01); *H01L 23/3171* (2013.01);
(Continued)

(58) Field of Classification Search
None
See application file for complete search history.

(56) References Cited

U.S. PATENT DOCUMENTS 9,183,572 B2  11/2015  Brubaker
9,385,224 B2  7/2016  Renaldo et al.
(Continued)

FOREIGN PATENT DOCUMENTS

EP  2202801 A2  6/2010
WO  2010016212 A1  2/2010
(Continued)

OTHER PUBLICATIONS

Non Final Office Action for U.S. Appl. No. 16/360,828 dated Apr. 24, 2020.
(Continued)

*Primary Examiner* — Kenneth Parker
*Assistant Examiner* — Long H Le
(74) *Attorney, Agent, or Firm* — Tarolli, Sundheim, Covell & Tummino LLP

(57) ABSTRACT

A transistor is provided that comprises a source region overlying a base structure, a drain region overlying the base structure, and a block of semiconducting material overlying the base structure and being disposed between the source region and the drain region. The block of semiconducting material comprises a gate controlled region adjacent the source region, and a drain access region disposed between the gate controlled region and the drain region. The drain access region is formed of a plurality of semiconducting material ridges spaced apart from one another by non-channel trench openings, wherein at least a portion of the non-channel trench openings being filled with a doped material to provide a depletion region to improve breakdown voltage of the transistor.

15 Claims, 9 Drawing Sheets

(51) Int. Cl.
- *H01L 29/66* (2006.01)
- *H01L 21/56* (2006.01)
- *H01L 23/31* (2006.01)
- *H01L 29/06* (2006.01)
- *H01L 21/02* (2006.01)

(52) U.S. Cl.
CPC ........ *H01L 29/0615* (2013.01); *H01L 29/155* (2013.01); *H01L 29/7783* (2013.01); *H01L 29/7788* (2013.01); *H01L 21/02068* (2013.01)

(56) References Cited

U.S. PATENT DOCUMENTS

| | | |
|---|---|---|
| 9,419,120 B2 | 8/2016 | Nechay et al. |
| 9,466,679 B2 | 10/2016 | Stewart et al. |
| 9,472,634 B2 | 10/2016 | Stewart et al. |
| 9,711,615 B2 | 7/2017 | Nechay et al. |
| 9,755,021 B2 | 9/2017 | Renaldo et al. |
| 9,773,897 B2 | 9/2017 | Nechay et al. |
| 9,780,181 B1 | 10/2017 | Teo et al. |
| 10,084,075 B2 | 9/2018 | Nechay et al. |
| 2004/0178422 A1* | 9/2004 | Tserng ............... H01L 29/66462 257/192 |
| 2008/0203430 A1 | 8/2008 | Simin et al. |
| 2009/0315037 A1 | 12/2009 | Kikkawa |
| 2012/0091522 A1* | 4/2012 | Ozaki ............... H01L 29/41766 257/330 |
| 2014/0264273 A1 | 9/2014 | Howell et al. |
| 2015/0028345 A1* | 1/2015 | Wong .................. H01L 29/7787 257/76 |
| 2015/0034904 A1 | 2/2015 | Fujimoto |
| 2015/0235123 A1 | 8/2015 | Afzali-Ardakanl et al. |
| 2015/0270356 A1 | 9/2015 | Palacios et al. |
| 2016/0126340 A1 | 5/2016 | Nechay et al. |
| 2016/0284828 A1 | 9/2016 | Shimizu et al. |
| 2016/0293713 A1* | 10/2016 | Nechay ................ H01L 29/404 |
| 2017/0125574 A1 | 5/2017 | Chowdhury et al. |
| 2019/0115448 A1 | 4/2019 | Chowdhury et al. |
| 2019/0115459 A1 | 4/2019 | Kim |
| 2020/0058782 A1 | 2/2020 | Then et al. |

FOREIGN PATENT DOCUMENTS

| | | |
|---|---|---|
| WO | 2010016213 A1 | 2/2010 |
| WO | 2017138398 A1 | 8/2017 |

OTHER PUBLICATIONS

Salihoglu, Atomic layer deposited passivation layers for superlattice photodetectors, 32 Journal of Vacuum Science & Technology B, Nanotechnology and Microelectronics: Materials, Processing, Measurement, and Phenomena 051201-1-051201-4 (2014), https://avs.scitation.org/doi/10.1116/1.4891164.

Ture, GaN-Based Tri-Gate High Electron Mobility Transistors, Dec. 2016, https://freidok.uni-freiburg.de/fedora/objects/freidok:13055/datastreams/FILE1/content.

Non Final Office Action for U.S. Appl. No. 16/252,952 dated Feb. 5, 2020.

* cited by examiner

PASSIVATED TRANSISTORS

TECHNICAL FIELD

The present disclosure relates generally to transistors, and more particularly to passivated transistors.

BACKGROUND

Certain heterostructure materials, such as aluminum gallium nitride (AlGaN) and GaN, create an electron well (i.e., a sheet of electrons) at the interface between the two dissimilar materials resulting from the piezoelectric effect and spontaneous polarization effect between those two dissimilar materials. The piezoelectric effect and spontaneous polarization cause a sheet of electrons at the interface between the two dissimilar materials called a two-dimensional electron gas ("2DEG") channel. Equally applicable is a lattice structure having a plurality of two-dimensional hole gas (2DHG) channels. Both of these types of structures are known as "2DxG channel(s)" devices. FETs that operate by generating and controlling the charge carriers in the 2DxG channel are generally called high electron mobility transistors ("HEMTs").

By stacking a plurality of these two-material heterostructures, and with the addition of appropriate doping in the layers to maintain the presence of the 2DxG channels when stacking a plurality of heterostructure layers, the charge sheets are able to act in parallel, allowing for greater current flow through the superlattice device. When this type of FET is "on", the superlattice device has a lower on-resistance, relative to a single heterostructure-layer device, because the multiple 2DxG channels allow a proportionally higher current to flow between the source and drain, resulting in an overall reduction in on-resistance. This type of structure has been well suited for providing an ultra-low channel resistance high-frequency switch.

A Super-Lattice Castellated gate Field Effect Transistor, or SLCFET, is a transistor built out of a superlattice of 2DxG channels (e.g. multiple pairs of barrier and channel epitaxial layers such as AlGaN/GaN grown and stacked on top each other to produce 2DEG or 2DHG channels). The SLCFET and other GaN three dimensional (3D) transistors have dispersion issues, which effect device performance. In standard 3D GaN based devices undesired currents can cause device errors and/or failure at the access regions of the device. In SLCFETs this current can gather in air pockets that form between the castellation regions during the device fabrication.

In a standard 3D GaN based devices, undesired currents can cause device errors and/or failure at the access regions of the device. In SLCFETs this current can gather in air pockets that form between the castellation regions during the device fabrication. Due in part to these air pockets, the dispersion of the non-passivated SLCFET devices can be approximately 84%. For a SLCFET device, there are 4 possible locations where the interface traps can cause dispersion. Namely, the semiconductor/gate dielectric interface caused by a castellation etch, surface treatments, and dielectric deposition process, the buffer region caused by the Epi material, the gate dielectric/gate metal interface as a result of the metal deposition process, and the gate dielectric/passivation interface in the access region as a result of the passivation process

SUMMARY

In one example, a method is provided of forming a transistor structure. The method includes forming semiconductor material over a base structure, etching openings in the semiconductor material to form a plurality of semiconductor material ridges spaced apart from one another by non-channel trench openings that form access regions, where each of the plurality of semiconductor material ridges having sidewalls, and forming a source region on a first end of the plurality of multichannel ridges and non-channel trench openings. The method further comprises forming a drain region on a second end of the plurality of multichannel ridges and non-channel trench openings, forming a gate contact that extends over a gate controlled region of the semiconductor material configured to control current flowing in the plurality of semiconductor material ridges, and depositing an alumina passivation layer that covers the transistor over at least a portion of the gate contact and covers the plurality of semiconductor material ridges and non-channel trench openings and fills the access regions to mitigate dispersion of the transistor.

In another example, a method of forming a transistor structure is provided. The method comprises forming a superlattice structure having a plurality of heterostructures over a base structure, and etching openings in the superlattice structure to form a plurality of multichannel ridges spaced apart from one another by non-channel trench openings forming access regions, each of the plurality of multichannel ridges having sidewalls. The method further comprises forming a source region on a first end of the plurality of multichannel ridges and non-channel trench openings, forming a drain region on a second end of the plurality of multichannel ridges and non-channel trench openings, and forming a gate contact that wraps around and substantially surrounds the top and sides of each the plurality of multichannel ridges along at least a portion of its depth, filling the non-channel trench openings in a gate controlled region. The gate contact separates the plurality of multichannel ridges and non-channel trench openings into a drain access region and a source access region. The method further comprises performing a cleaning process on the transistor structure, performing an atomic layer deposition process to deposit an alumina passivation layer that covers the transistor over a portion of the gate contact and covers the plurality of multichannel ridges and non-channel trench openings and fills the access regions to mitigate dispersion of the transistor, and performing an oven baking process after the depositing the alumina passivation layer.

In yet another example, a transistor is provided comprising a source region overlying a base structure, a drain region overlying the base structure, and a block of semiconducting material overlying the base structure and being disposed between the source region and the drain region. The block of semiconducting material comprises a plurality of semiconducting material ridges spaced apart from one another by non-channel trench openings that form access regions. The transistor further comprises a gate contact that extends over the gate controlled region to control current flowing in the plurality of semiconducting material ridges between the source region and the drain region, and an alumina passivation layer that covers the transistor over a portion of the gate contact and covers the block of semiconducting material and fills the access regions to mitigate dispersion of the transistor.

DETAILED DESCRIPTION

Figure 1:
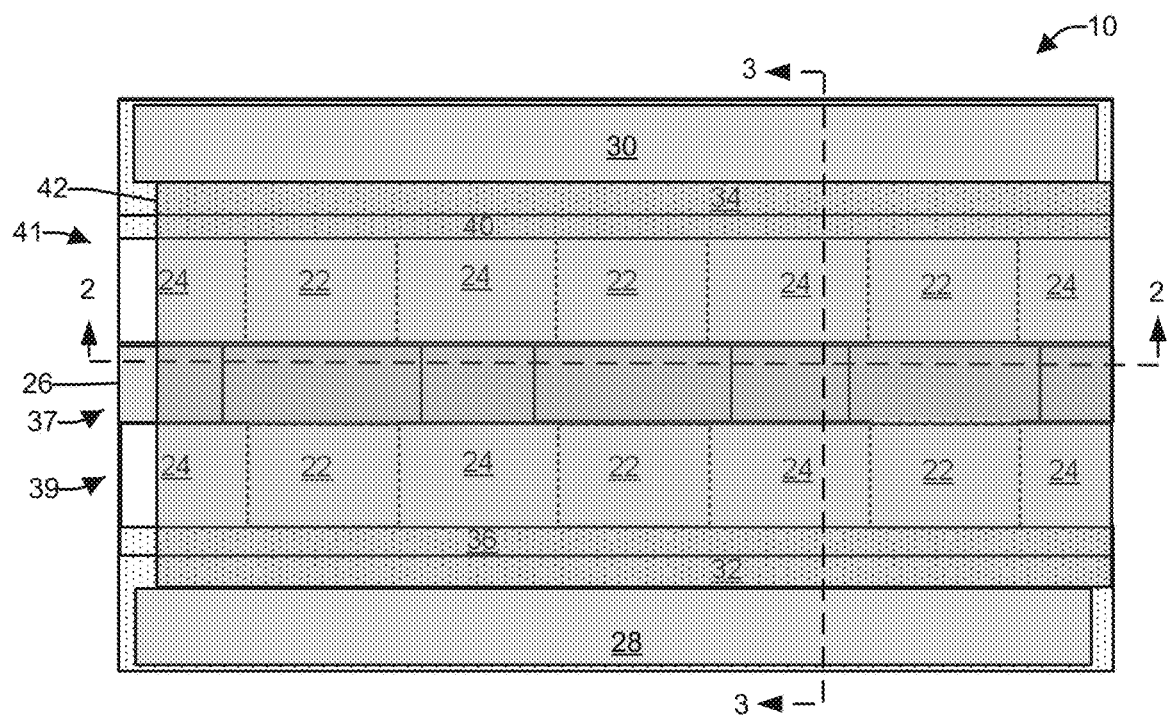
FIG. 1 illustrates a top plan view of an example passivated super-lattice castellated gate field-effect-transistor (SLCFET).

The present disclosure relates to a structure and method of forming and passivating a three-dimensional (3D) gallium nitride (GaN) based device, such as a SLCFET, using an atomic layer deposition (ALD) of alumina ($Al_2O_3$) as the passivation material to reduce the dispersion factor of the device. The present disclosure also covers 3D devices that employ a single block of semiconductor material with access regions to form semiconductor material ridges. Dispersion is a metric for switching devices that can be described as the match in device performance from RF and DC that is used to characterize the overall health of the device. A lower dispersion value or factor implies a healthier device with minimal surface states, and surface traps that are filled. Accordingly, the device can be passivated to eliminate undesired currents and to reduce the dispersion value.

A passivation method used on conventional planar GaN and GaAs devices covers the device with silicon nitride ($Si_3N_4$) using a plasma-enhanced chemical vapor deposition (PECVD) process. However, this deposition process is only a top level passivation, and therefore, would not completely fill the air pockets of a 3D device, and could even result in more pockets. Moreover, PECVD can cause damage to the device producing inferior devices. Tests performed on SLCFETs passivated with silicon nitride through the PECVD process resulted in devices with a dispersion value of 100%.

In one example, a method of forming and passivating a three-dimensional gallium nitride (GaN) based device includes a pre-cleaning process, a passivation layer ALD process, and an annealing process. The pre-cleaning process removes any carbon residue that may form prior to the ALD process. The pre-cleaning process can be an oxygen descum process performed immediately prior to the ALD process. The pre-cleaning process can be performed in an ALD system. In one example, the ALD process involves depositing approximately 300 Å alumina through a plurality of growth phases. Through ALD, there is passivation of the sidewalls in the access regions and gate filled regions, and the top of the device. With ALD, the alumina can be formed within the air pockets that are present in the 3D GaN based devices such as in the access and gate filled regions. Conformal ALD film fills the air pockets and ensures ALD deposition and interface control.

The final process is an annealing process in which a nitrogen gas filled temperature controlled oven is used to heat and then cool the passivated device. The temperature can range from about 200° C. to about 300° C. (e.g., 250° C.). The oven ramps up to the anneal temperature and then ramps down to allow the device to cool. In one example, the annealing process can last between about 3 to about 8 hours (e.g., about 4 hours). Through the annealing process, the interface states of the device are reduced and as a result the dispersion value of the finished devices is reduced to approximately 5%. The anneal in combination with the cleaning and passivation deposition process eliminates surface traps. Moreover, the method has a limited impact on RF performances compared to almost all other top passivation methods.

Figure 2:
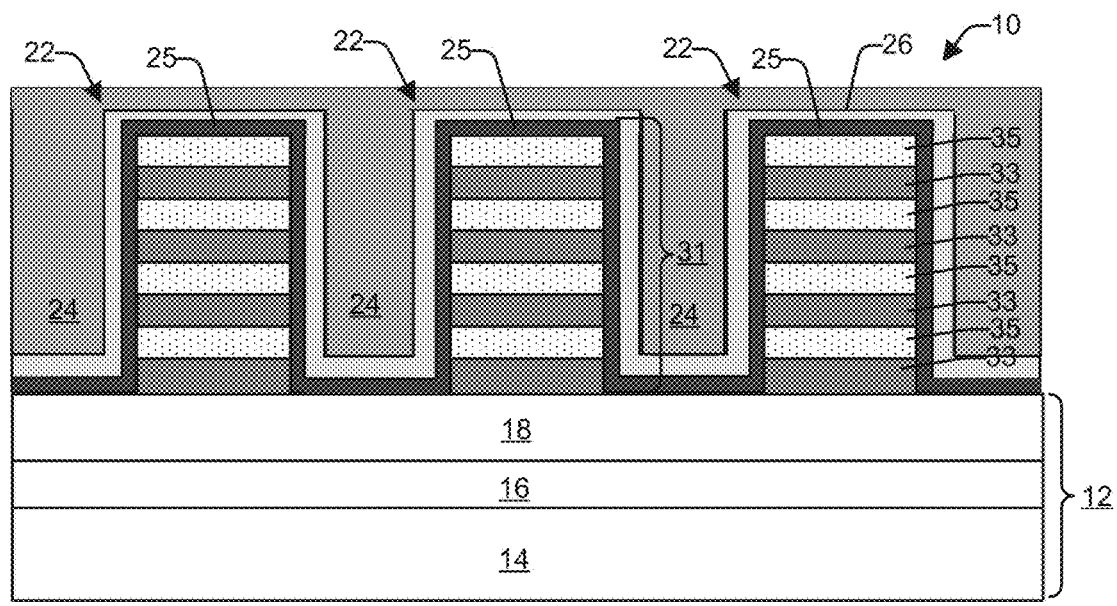
FIG. 2 illustrates a partial cross-sectional view of the example passivated SLCFET device of FIG. 1 along the lines 2-2.
Figure 3:
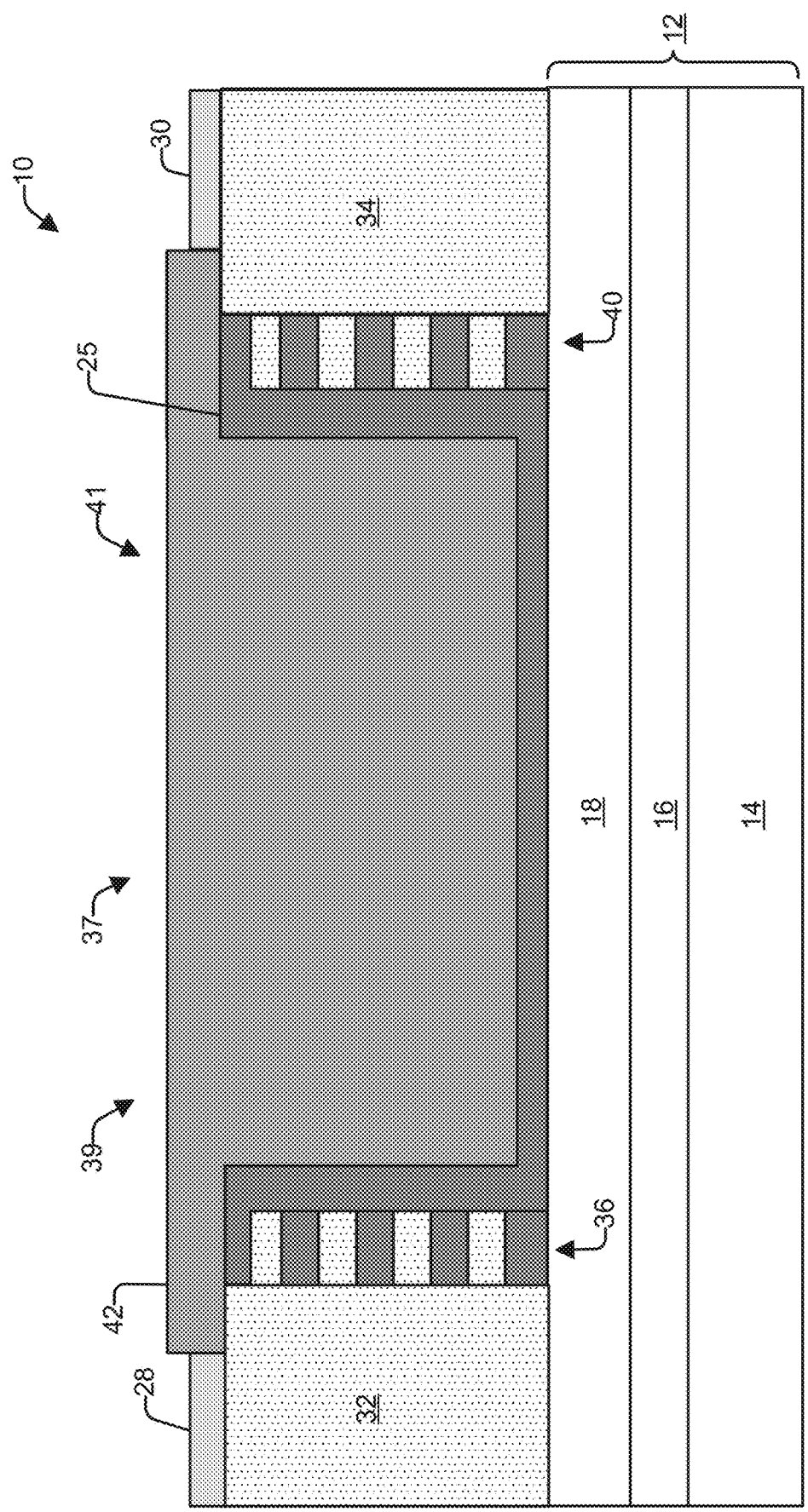
FIG. 3 illustrates a partial cross-sectional view of the example passivated SLCFET device of FIG. 1 along the lines 3-3.

FIGS. 1-3 illustrates different views of a SLCFET device with a alumina passivation layer, while FIGS. 4-17 illustrate a methodology for forming the SLCFET device of FIGS. 1-3. Although the examples of FIGS. 1-17 refer to a SLCFET device, the structures and methodologies are applicable to a single block of semiconductor material with a planar gate and access regions. FIG. 1 illustrates a top plan view of an example of a passivated SLCFET device 10. FIG. 2 illustrates a partial cross-sectional view of an example of a portion of the passivated SLCFET device 10 of FIG. 1 along the lines 2-2. FIG. 3 illustrates a cross-sectional view of the passivated SLCFET device 10 of FIG. 1 along the lines 3-3. The present examples illustrate a SLCFET device and a method of making a SLCFET device. However, the passivated transistor can be any 3D transistor device with access regions. A gate contact can be castellated when employing a gate control region that is castellated, or planar when employing a block like region of semiconductor material in the gate control region. The access regions can be on a drain-side access region of the gate or on a source-side region of the gate, or on both the drain-side access region and the source-side access region as shown in the examples of FIGS. 1-17.

Referring to FIGS. 1-3, the passivated SLCFET device 10 includes a plurality of multichannel ridges 22 that extend between a source interface 36 and a drain interface 40. Each of the plurality of multichannel ridges 22 include a plurality of channels formed from a plurality of heterostructures with each heterostructure being formed from an AlGaN layer overlying a GaN layer. A given heterostructure forms a portion of the channel of the device 10 with the plurality of multichannel ridges 22 collectively forming the entire channel of the device 10. The plurality of multichannel ridges 22 are separated from one another by non-channel trench openings 24. The non-channel trench openings 24 form the access region of the device. The source interface 36 connects the source region 32 to a first end of the plurality of multichannel ridges 22 and the drain interface 40 connects the drain region 34 to a second end of the plurality of multichannel ridges 24. A source contact 28 resides on top of the source region 32 and a drain contact 30 resides on top of the drain region 34.

Each of the source interface 36, and the drain interface 40 are also formed from the plurality of heterostructures that includes stacks of an AlGaN layer overlying a GaN layer with a portion being part of the multichannel ridge 22 and a portion acting as interfaces to connect the respective source and drain regions 32 and 34 and respective plurality of multichannel ridges 22 and non-channel trench openings 24. A castellated gate contact 26 extends over the multichannel ridges 22 and through the non-channel trench openings 24 in a gate controlled region 37 of the device 10. The castellated gate contact 26 separates the plurality of multichannel ridges 22 and non-channel trench openings 24 into a source access region 39 and a drain access region 41, and controls the current through the plurality of multichannel ridges 22 between the source region 32 and the drain region 34 during normal operation.

The passivated SLCFET device 10 is in a normal "ON" state when no voltage is applied to the castellated gate contact 26, and can be turned to an "OFF" state by applying a negative voltage to the castellated gate contact 26, which in turn controls whether or not current flows through the multichannel gate ridges 22 between the source region 32 and the drain region 34 when a bias is applied between the source region 32 and the drain region 34.

An alumina passivation layer 42 covers SLCFET device 10 over a portion of the gate contact 26 and covers the plurality of multichannel ridges 22 and non-channel trench openings 24, and fills the access regions on both the source access region 39 and the drain access region 41 to mitigate dispersion (e.g., reduce the dispersion value) of the transistor. The source contact 28, the drain contact 30 and a portion of the gate contact 26 remain exposed to allow for electrical contact to the device 10.

As illustrated in FIG. 2, each multichannel ridge 22 includes a plurality of heterostructures 31 that overly a base 12 (base structure). Three layers may be used to construct the base 12 including a substrate layer 14, a lattice matching material layer 16, and a buffer layer 18. The substrate layer 14 can be formed of Silicon Carbide (SiC), the lattice matching material layer 16 can be formed of Aluminum Galium Nitride layer (AlGaN), and the buffer layer 18 can be formed of an undoped GaN drift region. In one example implementation, an AlGaN layer 35 overlying a GaN layer 33 form a given layer of the heterostructure 31. Each heterostructure forms a portion of a channel of the multichannel gate formed from the plurality of multichannel ridges 22 of the passivated SLCFET device 10. A dielectric layer 25 (FIG. 2), for example, of silicon nitride (SiN) can reside in between plurality of multichannel ridges 22 and non-channel trench openings 24, and the gate contact 26 and passivation layer 42. The source interface 36 the drain interface 40 are also covered by the dielectric layer 25.

The multichannel ridges 22 can comprise a plurality of heterostructures that may number between 2 and K, where K is defined as the maximum number of heterostructures that can be grown, deposited or otherwise formed on each other without cracking or other mechanical failure in the layers or 2DEG channels. One of ordinary skill in the art appreciates that several values including the value of K, relative positions of AlGaN and GaN may be reversed, other suitable materials may be used, and other parameters, options, and the like that are desirable may be used to implement the multichannel ridges 22. By stacking a plurality of these two-material heterostructures, and with the addition of appropriate doping in the layers to maintain the presence of the 2DEG or 2DHG channels when stacking a plurality of heterostructure layers, the sheets of charge are able to act in parallel, allowing for greater current flow through each heterostructure.

Carriers, which form a 2DEG in a standard channel of AlGaN/GaN, may be spontaneously generated and maintained due to piezoelectric and spontaneous polarization, or introduced with doping. For example, the AlGaN barrier is strained by virtue of its epitaxial relationship with the GaN channel and since these materials are piezoelectric, free carriers are generated in the channel. The strain state of barrier and channel layers used, in some examples, may control the carrier concentration in the AlGaN/GaN heterostructures. One of ordinary skill in the art understands that precise control of composition, thickness, and the ordering of the AlGaN and GaN layers provides for the precise control of the production of the passivated SLCFET device 10. An epitaxial scheme and device fabrication method may exploit this phenomenon.

Figure 4:
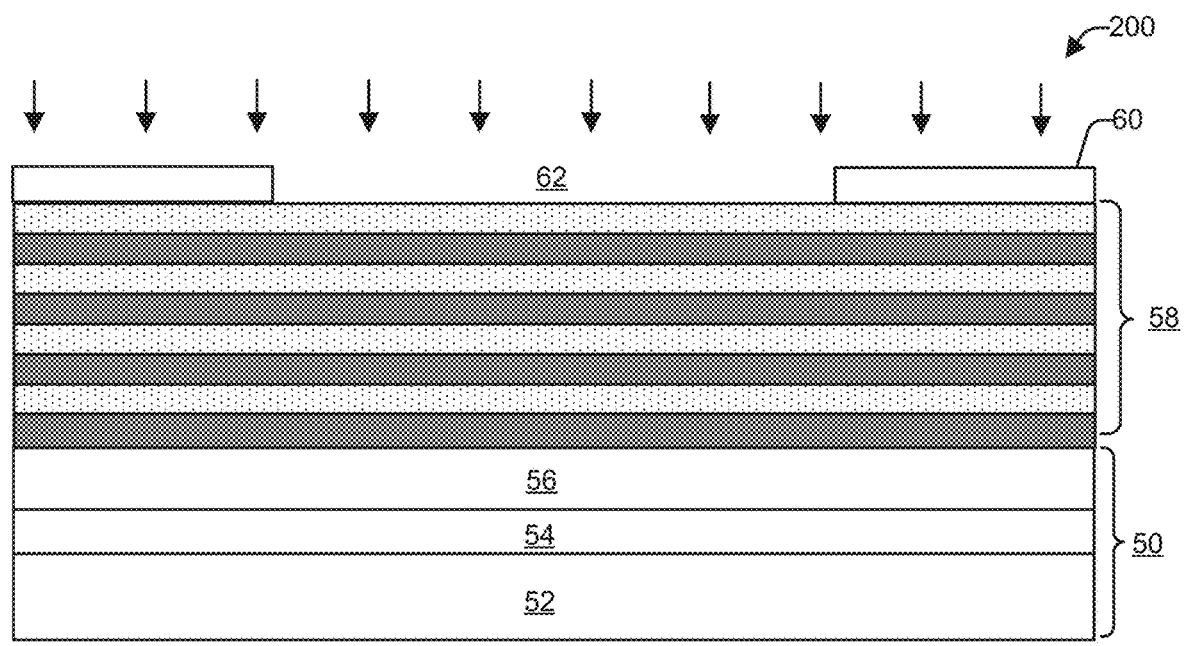
FIG. 4 illustrates an example cross-sectional view of a passivated SLCFET early in the manufacturing process after formation of a mask over a superlattice structure and while undergoing an etch process.
Figure 5:
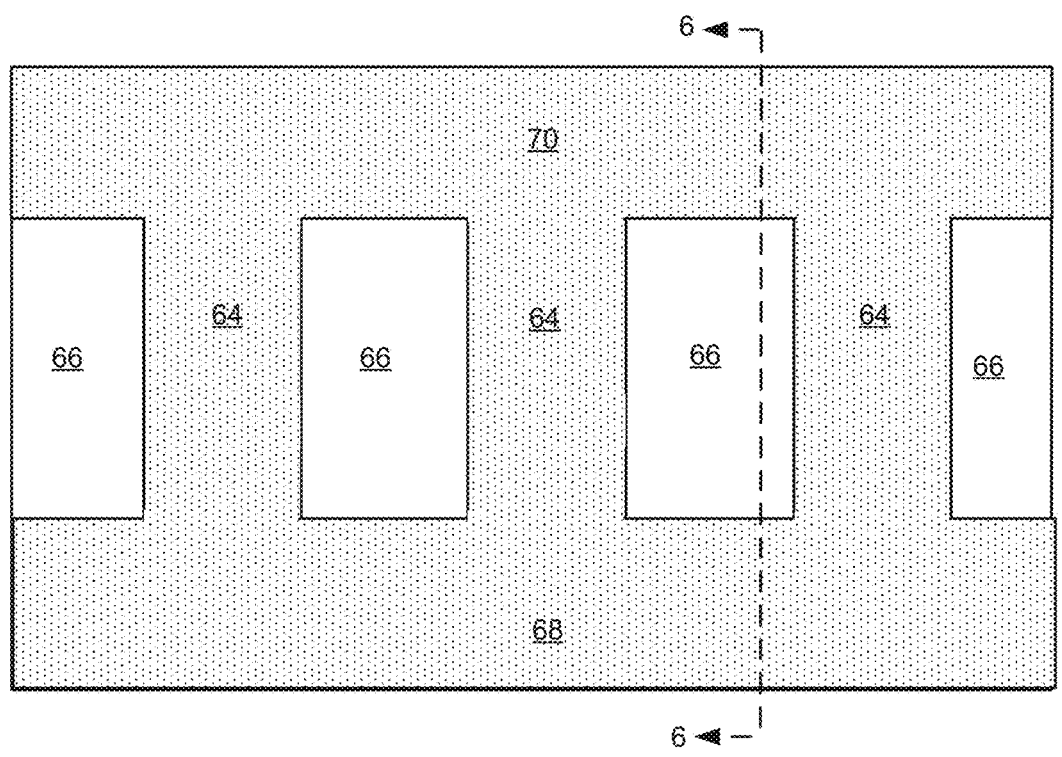
FIG. 5 illustrates an example top plan view of the passivated SLCFET of FIG. 4 after undergoing the etch process of FIG. 4.
Figure 6:
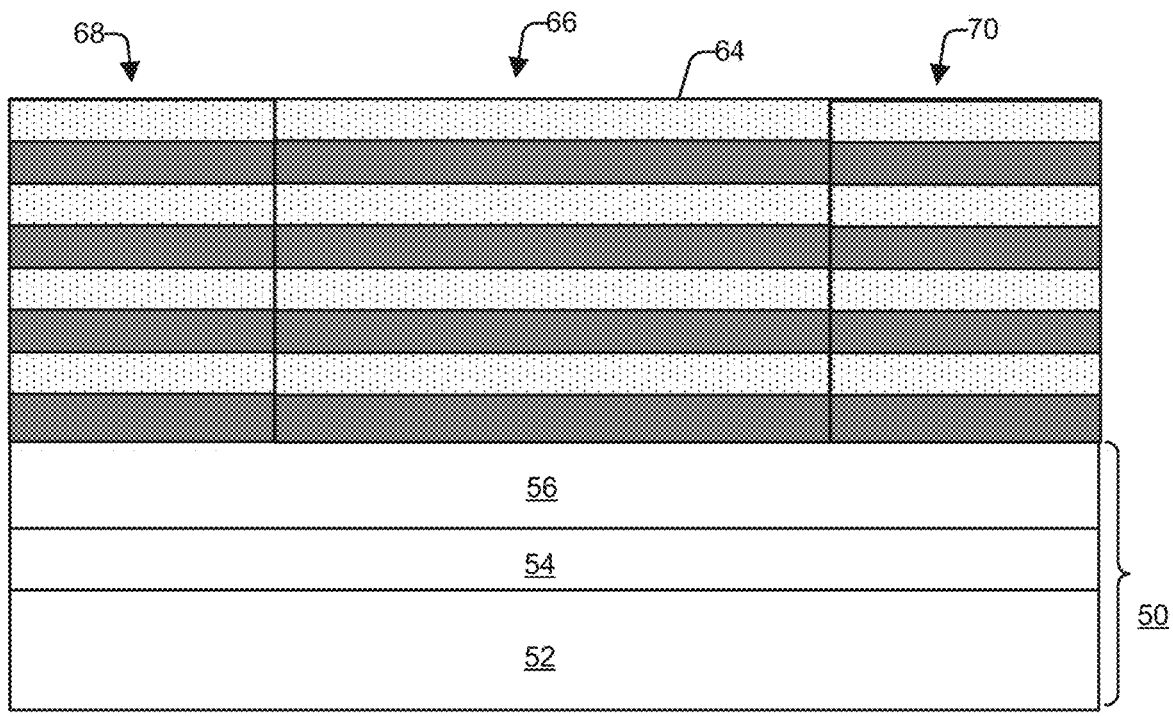
FIG. 6 illustrates an example cross-sectional view of the passivated SLCFET of FIG. 4 after undergoing the etch process of FIG. 4.

FIGS. 4-17, illustrate an example method of fabrication in connection with formation of the example passivated SLCFET device illustrated in FIGS. 1-3. FIG. 4 illustrates a cross-sectional view of a passivated SLCFET device in its early stages of fabrication starting with a base structure 50. As discussed earlier, three layers may be used to construct the base structure 50 including a substrate layer 52, a lattice matching material layer 54, and a buffer layer 56.

A superlattice heterostructure 58 has been fabricated across the entire upper surface of the buffer layer 56 resulting in the structure of FIG. 4. In one example implementation, each heterostructure is formed from an AlGaN layer overlying a GaN layer. Example methods of fabrication involve sequential growth of multichannel profiles in a monolithic epitaxial scheme known by those of ordinary skill in the art. By sequentially growing the epitaxial multichannel layers that will later become devices and appropriate doping, all devices fabricated from this structure will benefit from the inherently high quality material properties, atomically flat interfaces and compositional control associated with epitaxial growth. The superlattice heterostructure 58 forms a block of semiconductor material. In alternate example, a single block of semiconductor material could be employed for forming channel regions of a 3D transistor device that is not necessarily a SLCFET device.

The epitaxial growth of different materials upon each other may optionally be enhanced with appropriate deposition technique(s) until the layered heterostructures illustrated in FIG. 4 has been produced. Any suitable technique for depositing each layer can be employed such as metal organic chemical vapor deposition (MOVCD), molecular beam epitaxy (MBE), Low Pressure Chemical Vapor Deposition (LPCVD), Plasma Enhanced Chemical Vapor Deposition (PECVD), High Density Chemical Plasma Vapor Deposition (HDPCVD), Atomic Layer Deposition (ALD), physical vapor deposition or high density plasma chemical vapor deposition (HDPCVD) techniques, or other suitable deposition techniques.

An etch mask 60 has been formed overlying the superlattice heterostructure 58. The etch mask 60 can be formed by depositing, patterning and developing a photoresist material layer over the superlattice heterostructure 58. The etch mask 60 specifies unblocks areas where opening 62 is shown. Additionally, FIG. 4 illustrates the structure undergoing an etch process 200 to form the openings 66 through the superlattice heterostructure. The etch process 200 employing the etch mask 60 is used to form a plurality of multichannel drain ridges 64 and non-channel trench openings 66 from the superlattice heterostructure 58, as illustrated in the plan view of FIG. 5. The superlattice heterostructure remains in source area 68 and drain area 70. The etch mask 60 can then be removed to provide the resultant structure illustrated in the top plan view of FIG. 5 and the cross-sectional view of FIG. 6 along the lines 6-6 of FIG. 5.

Techniques for forming alternating multichannel ridges and non-channel trench openings are disclosed in commonly owned U.S. Pat. No. 9,419,120, entitled, "Multichannel Devices with Improved Performances and Methods of Making the Same", and commonly owned U.S. Pat. No. 9,773,897, entitled, "Multichannel Devices with Gate Structures to Increase Breakdown Voltage", both of which are herein incorporated by reference in their entirety herein.

Figure 7:
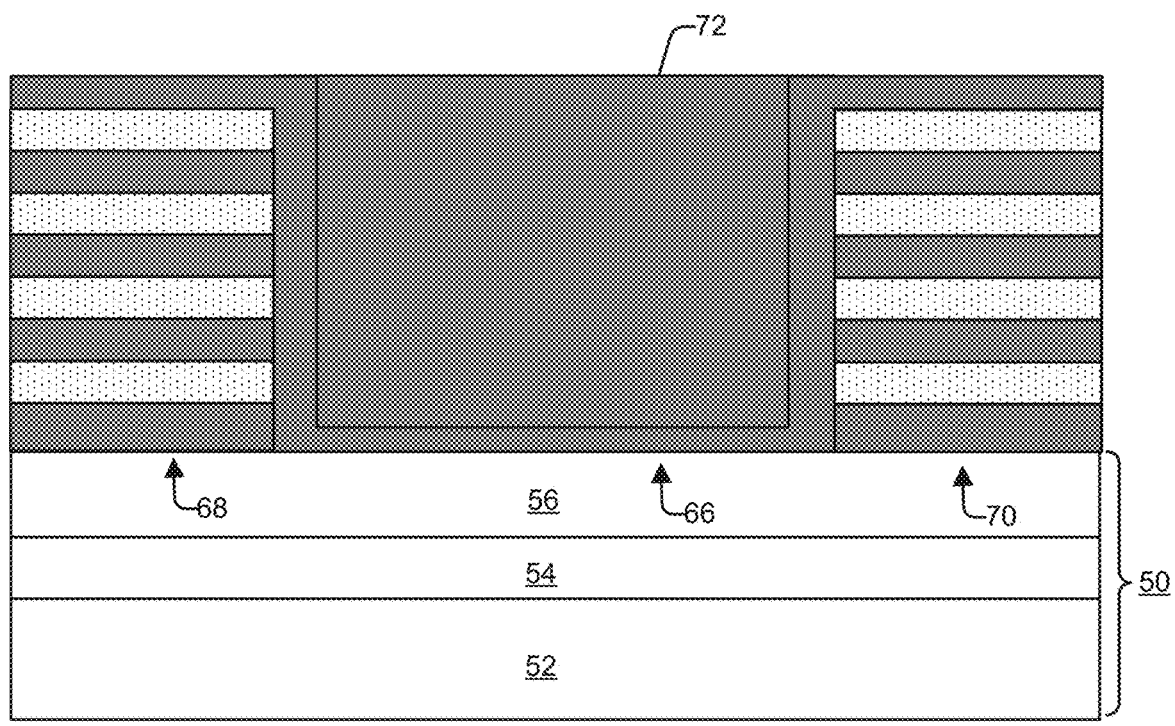
FIG. 7 illustrates an example cross-sectional view of the passivated SLCFET device of FIG. 6 after deposition of a dielectric material layer.

Next, a gate dielectric deposition process is performed to cover the device with a dielectric material layer 72 to provide the resultant structure of FIG. 7. The dielectric material layer 72 prevents leakage between the gate and the 2DEG layers formed in the superlattice. The dielectric material layer 72 eliminates leakage in the 2DEGs in the multichannel ridges 64.

Figure 8:
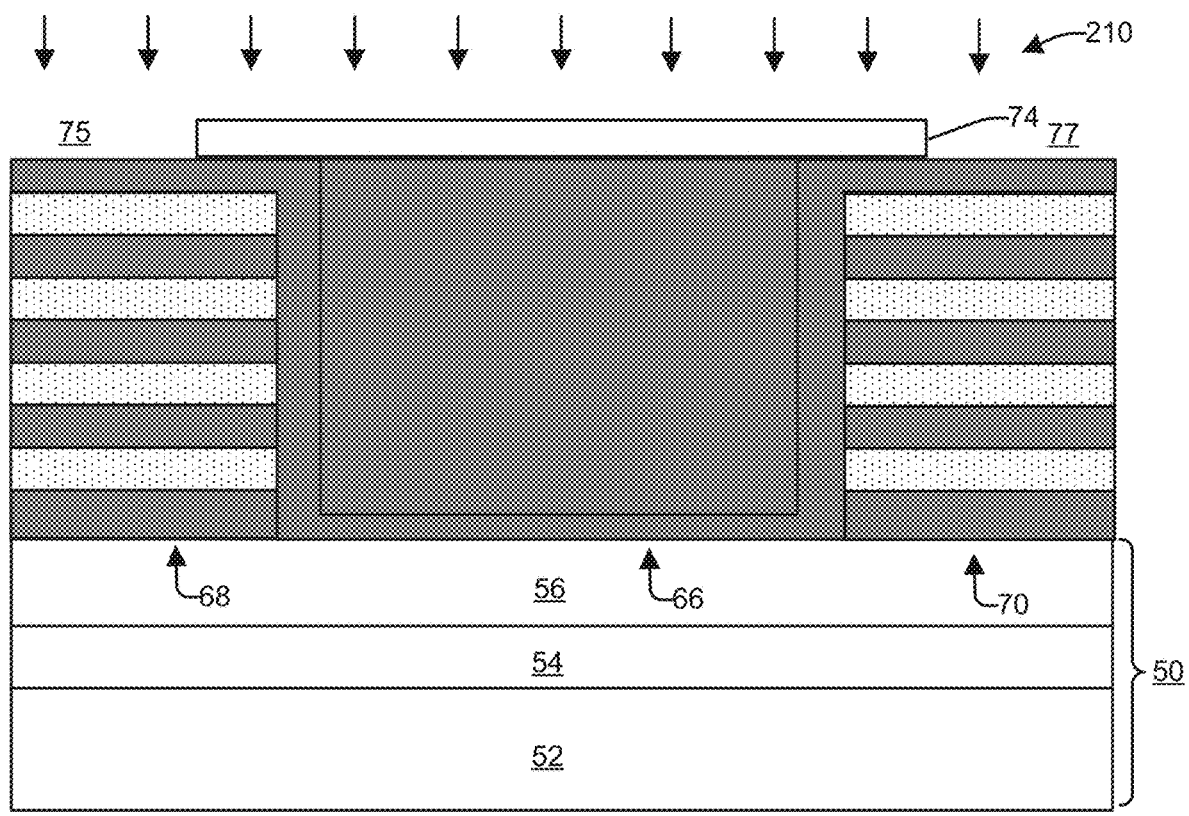
FIG. 8 illustrates an example cross-sectional view of the passivated SLCFET device of FIG. 7 after formation of a mask and while undergoing an etch process.
Figure 9:
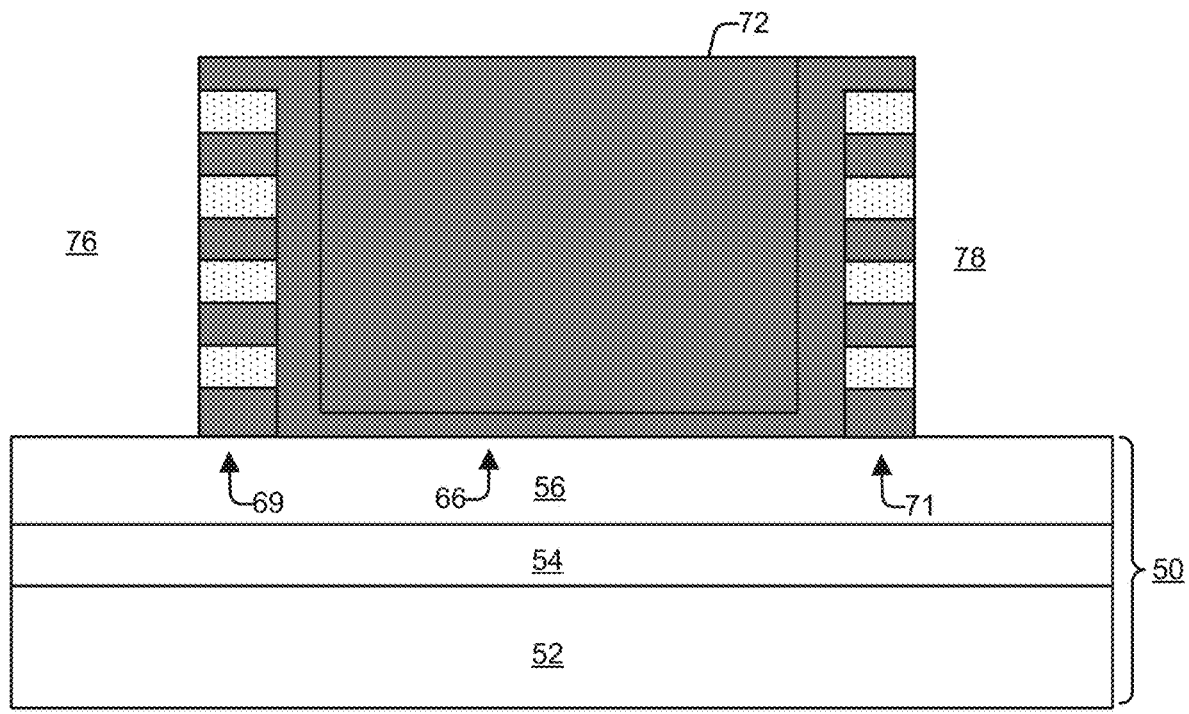
FIG. 9 illustrates an example cross-sectional view of the SLCFET device of FIG. 8 after undergoing the etch process of FIG. 8.

FIG. 8 illustrates formation of an etch mask 74 with patterned openings 75 and 77 over the structure of FIG. 7. Additionally, FIG. 8 illustrates the structure undergoing an etch process 210 to form the openings 76 and 78 for depositing or regrowing heavily doped ohmic contact material in the openings 76 and 78. The resultant structure is illustrated in FIG. 9 after the etch process 210 has been completed, and the etch mask removed. Next, the structure of FIG. 9 undergoes a deposition or regrowth process to fill the openings 76 and 78 with heavily doped material such as n+ doped Gallium Nitride (GaN) to form source region 80 and drain region 82, and provide the resultant structure of FIG. 10. A source interface 81 remains that connects the source region 80 to the multichannel ridges 64 on a first end, and a drain interface 83 connects the drain region 82 to the multichannel ridges 64 on a second end.

Figure 10:
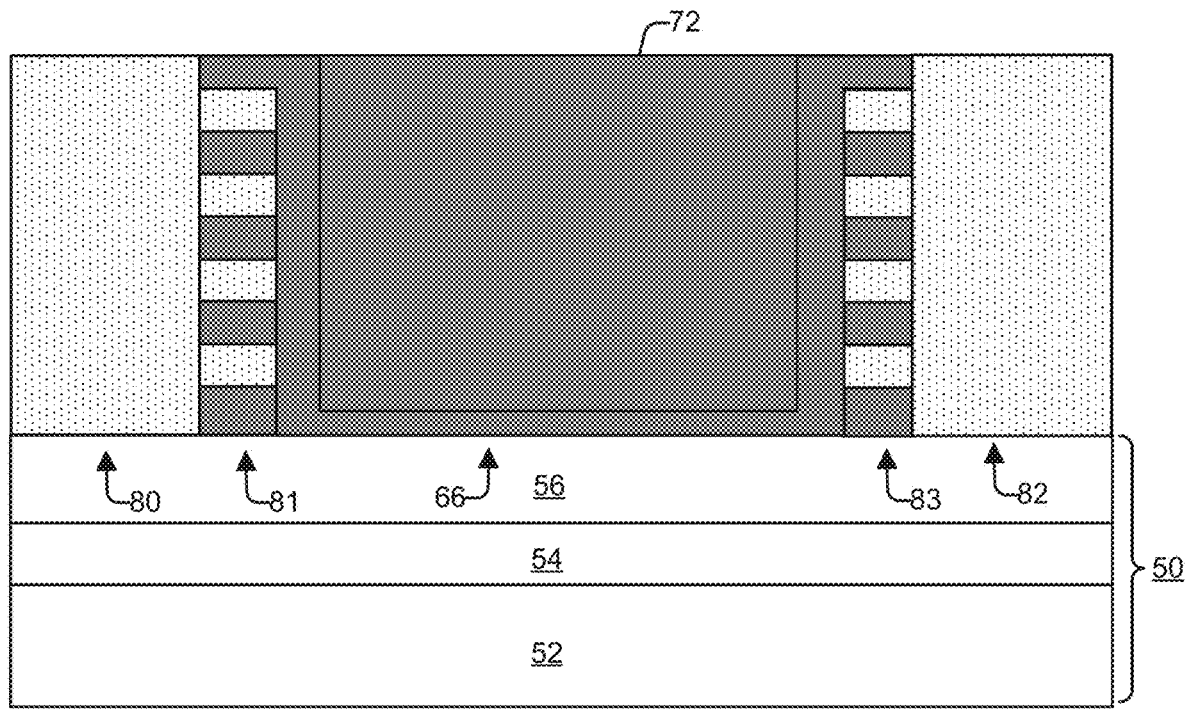
FIG. 10 illustrates an example cross-sectional view of the passivated SLCFET device of FIG. 9 after a material fill or regrowth process to form source and drain regions.
Figure 11:
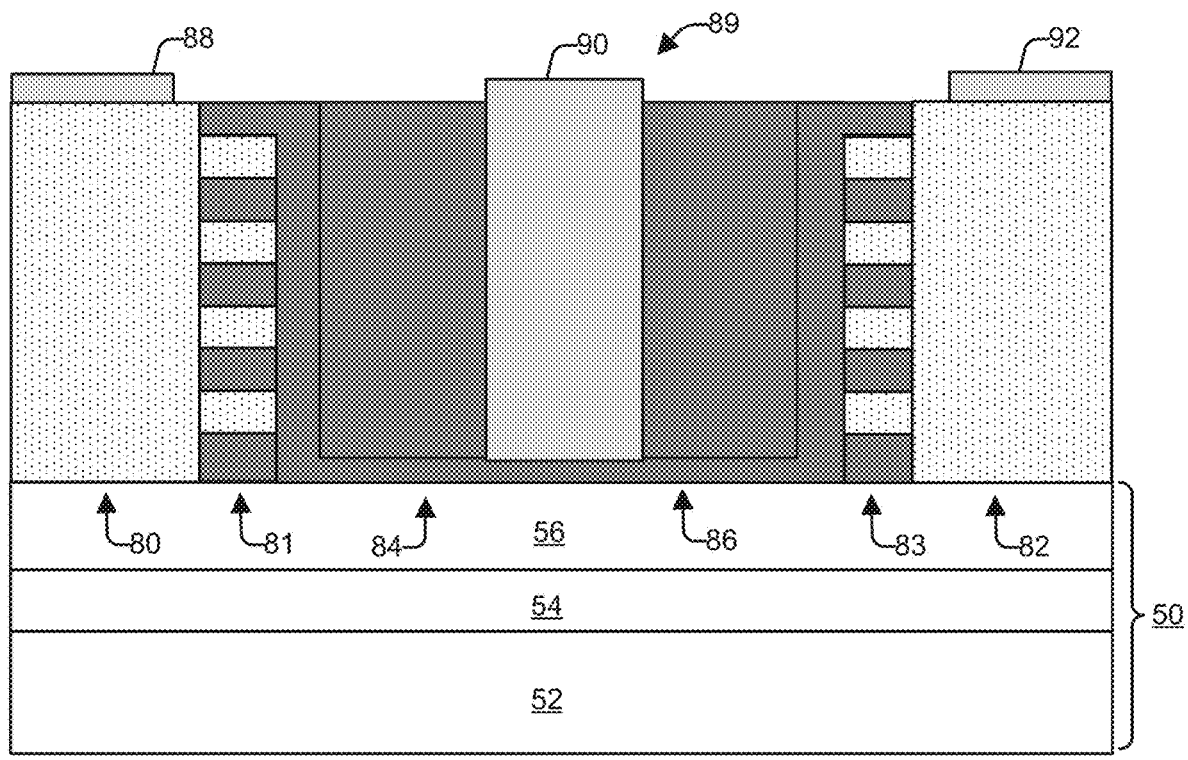
FIG. 11 illustrates an example cross-sectional view of the passivated SLCFET device of FIG. 10 after formation of source, drain and gate contacts.

FIG. 11 illustrates the structure of FIG. 10 after a contact formation process to form a source contact 88 on top of the n+ regrowth source region 80 and a drain contact 92 on top of the n+ growth drain region 82. Concurrently, previously or subsequently, a castellated gate contact 90 is formed over the multichannel ridges 64 in a gate region 89 of the device. The castellated gate contact 90 separates the plurality of multichannel ridges 64 and non-channel trench openings 66 into a source access region 84 and a drain access region 86, and controls the current through the plurality of multichannel ridges 64. Photodeposition patterning and metallization processes can be employed to form the source contact 88, the drain contact 92, and the castellated gate contact 90.

Figure 12:
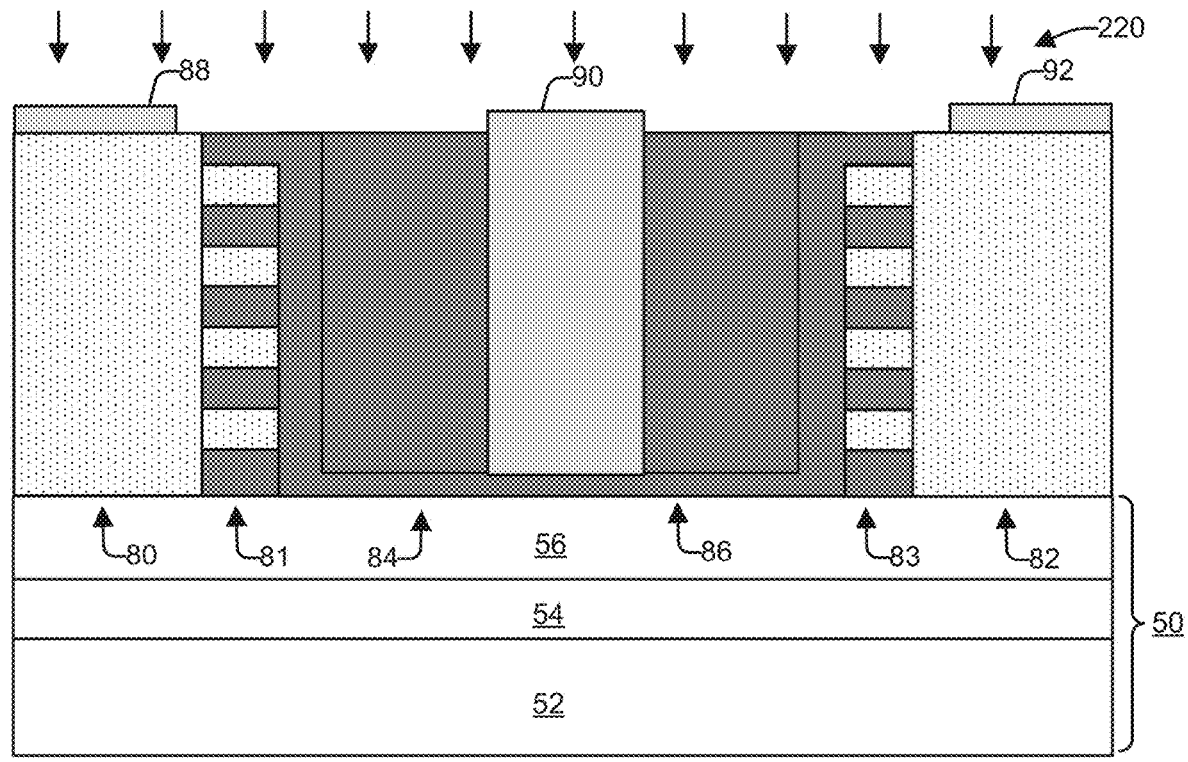
FIG. 12 illustrates cross sectional view of the passivated SLCFET device of FIG. 11 undergoing a cleaning process.

FIG. 12 illustrates performing a plasma cleaning process 220 on the top side of the structure of FIG. 11 to remove residue (e.g., hydrocarbons) from a top surface of the structure. The pre-cleaning process removes any carbon residue that may form prior to the ALD process. The structure can reside in a chamber for performing the plasma cleaning process 220, which can be an oxygen (02) based plasma ashing descum process. In the oxygen based plasma ashing descum process, oxygen is used to remove residue to form an ash which may be removed using a vacuum pump.

Figure 13:
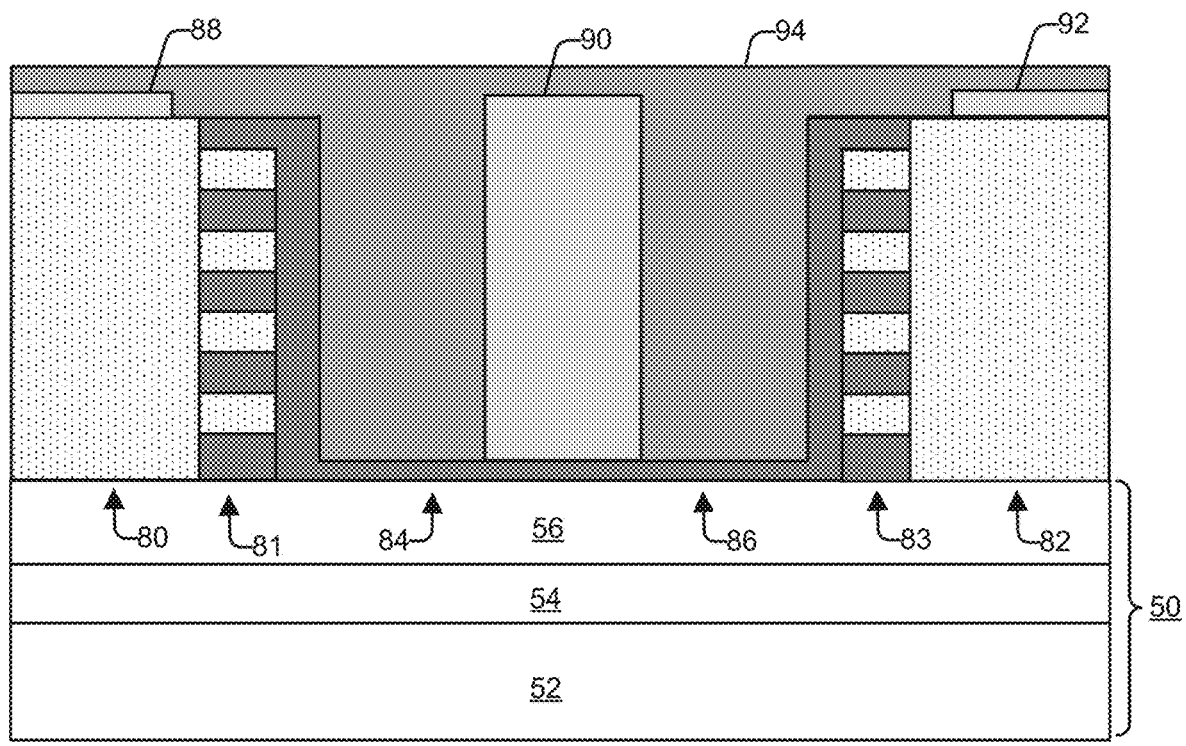
FIG. 13 illustrates a cross-sectional view of the structure of FIG. 12 after atomic layer deposition of alumina.

Next an alumina deposition is performed on the structure of FIG. 12 to deposit a passivation layer 94 and provide the structure of FIG. 13. In one example, about 200 Å to about 1000 Å (e.g., about 300 Å) of alumina is deposited on the structure of FIG. 12 utilizing an atomic layer deposition (ALD) process. The ALD process covers the entire structure covering the source contact 88, the n+ regrowth source region 80, the drain contact 92, the drain region 82, the multichannel ridges 64, and the castellated gate contact 90. The ALD deposition process further fills in the non-channel trench openings 66 in both a source side access region and a drain side access region. Compared to conventional compound semiconductor devices, the unique 3D morphology of the SLCFET makes the deposited alumina part sidewall and top passivation. Due to the conformal coverage, the access region as well as the gaps within the gate fill region are conformal filled. This results in the elimination of surface traps producing record low dispersion values.

In one example, the alumina deposition process includes introducing separate gases of an aluminum precursor and an oxygen precursor into the deposition chamber. In one example, the precursors of the ALD process includes an aluminum precursor of tri-methyl aluminum, and an oxygen precursor of water. In another example, the precursors of the ALD process includes an aluminum precursor, and an oxygen precursor of ozone. Other examples could include any combination of tri-methyl aluminum or aluminum chloride as the aluminum precursor, and water, ozone, oxygen or hydrogen peroxide as the oxygen precursor. However, many other precursors could be employed for an ALD process, such that other materials could be employed as a passivation layer (e.g., aluminum nitride, silicon nitride) utilizing the ALD process. In one example, a nitrogen carrier gas is introduced into the deposition chamber for about an hour. The deposition is done at a temperature of about 120° C. The nitrogen is purged and tri-methyl aluminum is introduced into the deposition chamber for about 0.05 to about 0.3 (e.g., about 0.1) seconds followed by a purge, and then water is then introduced into the deposition chamber for about 0.05 to about 0.3 (e.g., about 0.1) seconds and then purged to form a thin alumina film (0.9-1.25 A/cycle). The process is then repeated 150-750 times. It is appreciated that a variety of other process recipes could be employed to form a passivation layer of appropriate thickness employing ALD.

Figure 14:
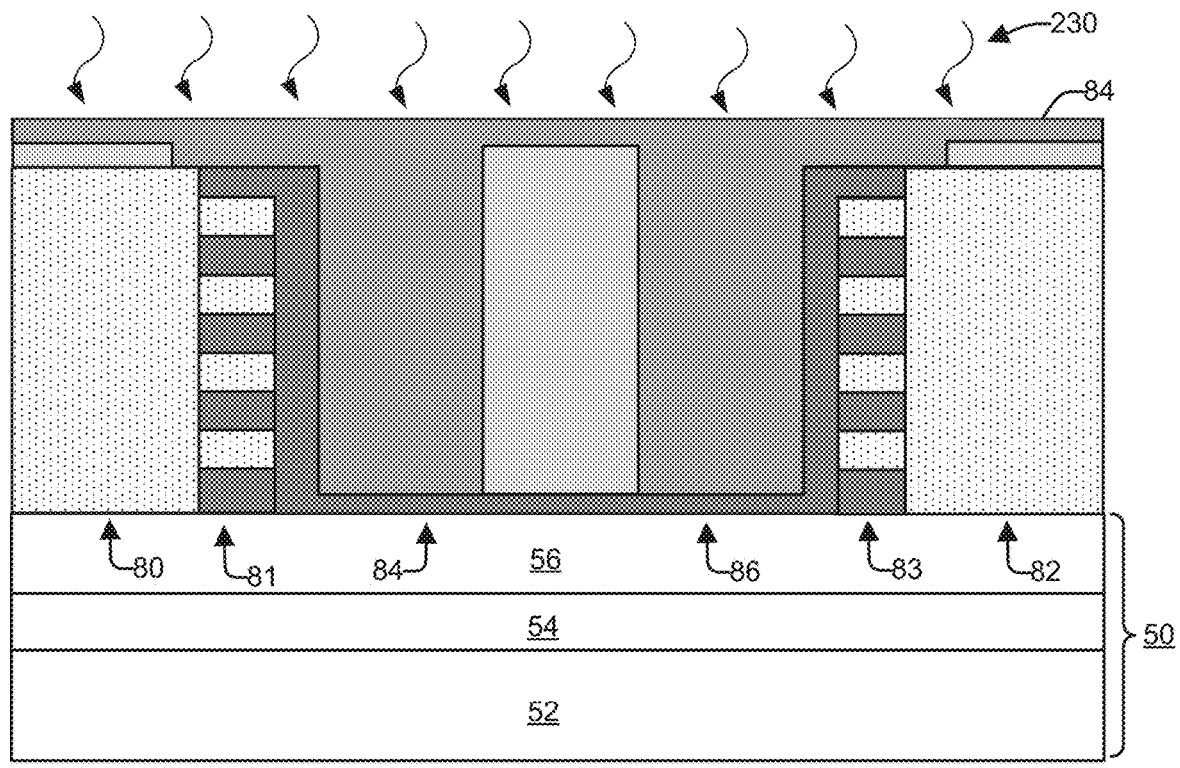
FIG. 14 illustrates a cross-sectional view of the structure of FIG. 13 while undergoing an oven bake process.

The structure of FIG. 13 then undergoes a baking process 230 in an oven as illustrated in FIG. 14. The oven can be a programmable oven with a controlled temperature ramp up and ramp down. The program being used can purge out atmosphere air (Oxygen) during the pump down several times while back filling the oven chamber with an inert gas (e.g., nitrogen ($N_2$)) before the bake cycle starts. Other inert gases could be employed, such as Argon (Ar), Helium (He), Krypton (Kr), Neon (Ne), or other inert gases. The structure of FIG. 15 can be annealed in an inert gas environment with oxygen levels below 50 parts-per-million (ppm) at a temperature of about 200° C. to about 300° C. (e.g., about 250° C.) for about 3 to about 8 hours (e.g., 4 hours).

Figure 15:
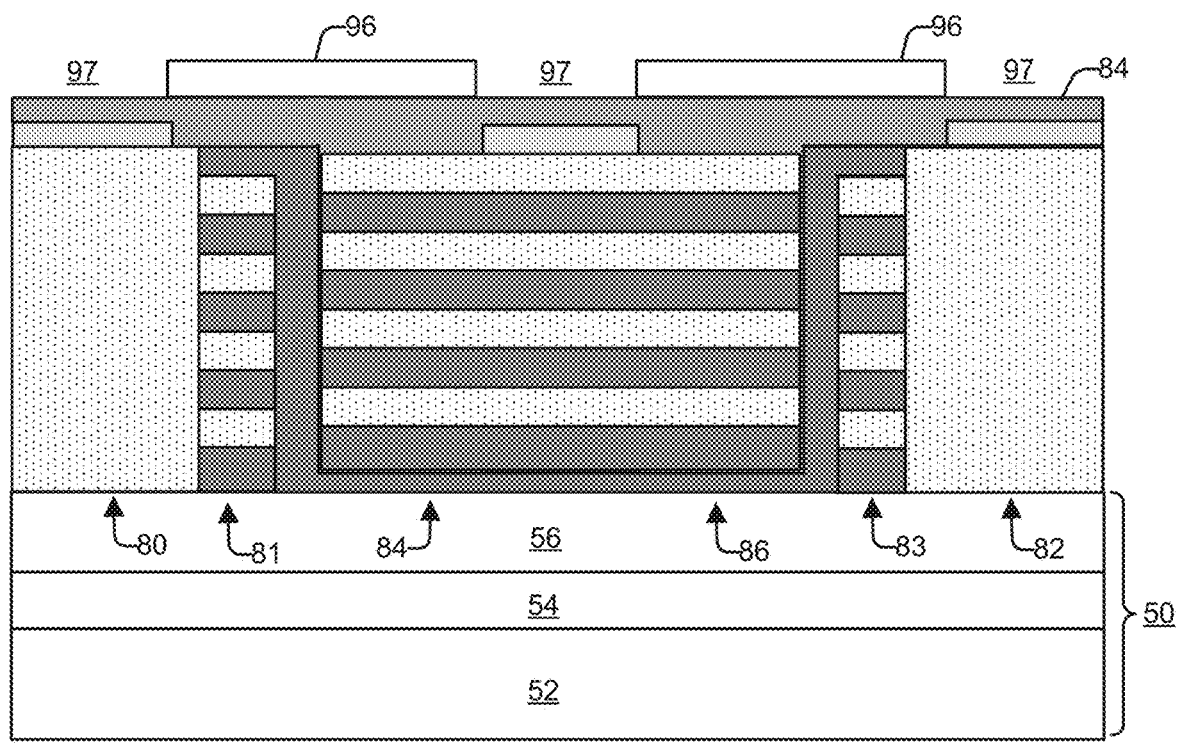
FIG. 15 illustrates an example cross-sectional view of the passivated SLCFET device of FIG. 14 after formation of a mask, and along the cross-section defined by lines 15-15 shown in FIG. 17.
Figure 16:
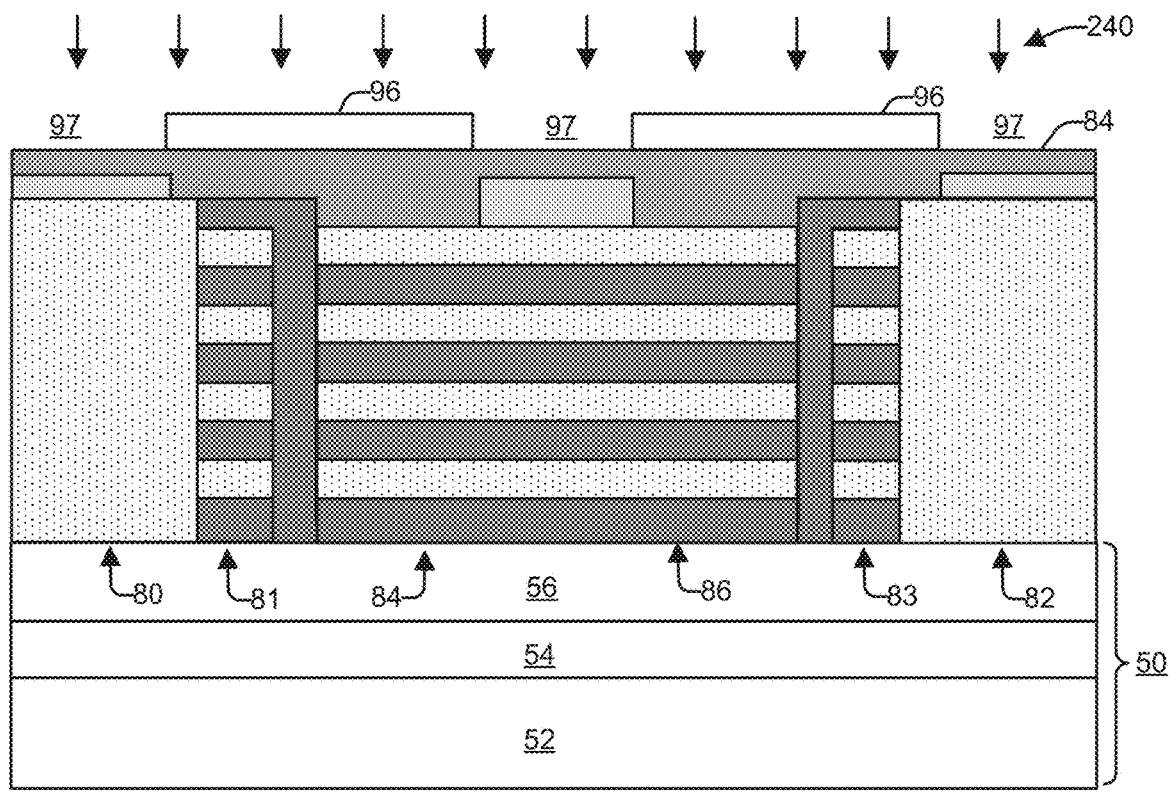
FIG. 16 illustrates an example cross-sectional view of the passivated SLCFET device of FIG. 15 while undergoing an etch process, and along the cross-section defined by lines 15-15 shown in FIG. 17.
Figure 17:
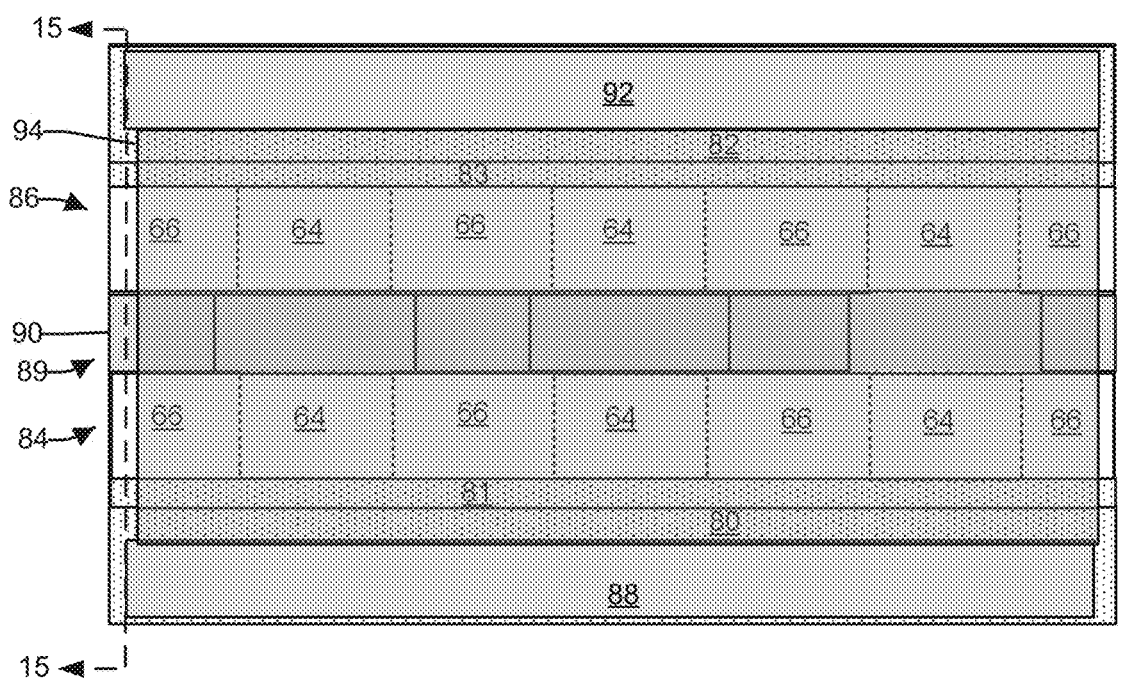
FIG. 17 illustrates an example a top plan view of the passivated SLCFET device of FIG. 16 after a photoresist strip.

Next, an etch mask 96 is formed overlying the structure of FIG. 14 to provide the structure of FIG. 15. The etch mask 96 can be formed by depositing, patterning and developing a photoresist material layer over the structure of FIG. 14. The etch mask 96 specifies unblocks areas 97 where openings in the passivation layer 94 can be formed to allow for electrical contact to the device. FIG. 16 illustrates the structure of FIG. 15 undergoing an etch process 240 to form openings 98 in the passivation layer 94 (see FIG. 17) to the source contact 88, the drain contact 92 and the castellated gate contact 90. FIG. 17 illustrates a top plan view of the final structure after the photoresist material layer 96 has been stripped.

What has been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A method of forming a transistor structure, the method comprising:
    forming a semiconductor material over a base structure;
    etching openings in the semiconductor material to form a plurality of multichannel ridges spaced apart from one another by non-channel trench openings that form access regions, each of the plurality of multichannel ridges having sidewalls;
    forming a source region on a first end of the plurality of multichannel ridges and non-channel trench openings;
    forming a drain region on a second end of the plurality of multichannel ridges and non-channel trench openings;
    forming a gate contact that extends over a gate controlled region of the semiconductor material configured to control current flowing in the plurality of multichannel ridges;
    performing a cleaning process via an atomic layer deposition system; and
    depositing an alumina passivation layer that covers the transistor over at least a portion of the gate contact and covers the plurality of multichannel ridges and non-channel trench openings and fills the access regions to mitigate dispersion of the transistor.

2. The method of claim 1, wherein the cleaning process includes an oxygen descum pre-cleaning process.

3. The method of claim 1, wherein the cleaning process is an in-situ clean using the atomic layer deposition system.

4. The method of claim 1, further comprising performing a baking process after the depositing the alumina passivation layer.

5. The method of claim 4, wherein the baking process comprises performing an oven anneal in an oven upon purging oxygen from the oven and back filling the oven with an inert gas, and then performing the oven anneal at a temperature of about 200° C. to about 300° C. for about 3 to about 8 hours.

6. The method of claim 1, wherein the depositing an alumina passivation layer comprises performing a layer-by-layer atomic layer deposition process.

7. The method of claim 6, wherein the layer-by-layer atomic layer deposition process comprises:
    disposing the transistor structure into a deposition chamber;
    introducing an inert gas into the deposition chamber for a predetermined time;
    purging the inert gas from the chamber;
    setting the temperature of the deposition chamber to predetermined deposition temperature;
    introducing an aluminum precursor into the deposition chamber for about 0.05 to about 0.3 seconds and then purging the aluminum precursor;
    introducing an oxygen precursor into the deposition chamber for about 0.05 to about 0.3 seconds and then purging the oxygen precursor to form a thickness of alumina; and
    repeating the introducing an aluminum precursor and purging and the introducing an oxygen precursor and purging until a desired thickness of alumina is achieved.

8. The method of claim 7, wherein the aluminum precursor is one of tri-methyl aluminum or aluminum chloride and the oxygen precursor is one of water, ozone, oxygen or hydrogen peroxide.

9. The method of claim 1, wherein forming semiconductor material over a base structure comprises forming a superlattice structure having a plurality of heterostructures over a base structure and etching openings in the semiconductor material comprises etching openings in the superlattice structure to form a plurality of multichannel ridges spaced apart from one another by non-channel trench openings that form access regions, each of the plurality of multichannel ridges having sidewalls.

10. A method of forming a transistor structure, the method comprising:
    forming a superlattice structure having a plurality of heterostructures over a base structure;
    etching openings in the superlattice structure to form a plurality of multichannel ridges spaced apart from one another by non-channel trench openings forming access regions, each of the plurality of multichannel ridges having sidewalls;
    forming a source region on a first end of the plurality of multichannel ridges and non-channel trench openings;
    forming a drain region on a second end of the plurality of multichannel ridges and non-channel trench openings;
    forming a gate contact that wraps around and substantially surrounds the top and sides of each the plurality of multichannel ridges along at least a portion of its depth, filling the non-channel trench openings in a gate controlled region, the gate contact separating the plurality of multichannel ridges and non-channel trench openings into a drain access region and a source access region;
    performing a cleaning process on the transistor structure;
    performing an atomic layer deposition process to deposit an alumina passivation layer that covers the transistor over a portion of the gate contact and covers the plurality of multichannel ridges and non-channel trench openings and fills the access regions to mitigate dispersion of the transistor; and
    performing an oven baking process after the depositing the alumina passivation layer.

11. The method of claim 10, wherein the cleaning process is an oxygen descum process.

12. The method of claim 10, wherein the cleaning process is an in-situ clean using an atomic layer deposition (ALD) system.

13. The method of claim 10, wherein the oven baking process comprises performing an oven anneal in an oven upon purging oxygen from the oven and back filling the oven with an inert gas, and then performing the oven anneal at a temperature of about 200° C. to about 300° C. for about 3 to about 8 hours.

14. The method of claim 10, wherein the atomic layer deposition process comprises:
- disposing the transistor structure into a deposition chamber;
- introducing an inert gas into the deposition chamber for a predetermined time;
- purging the inert gas from the chamber;
- setting the temperature of the deposition chamber to a predetermined deposition temperature;
- introducing an aluminum precursor into the deposition chamber for about 0.05 to about 0.3 seconds and then purging the aluminum precursor;
- introducing an oxygen precursor into the deposition chamber for about 0.05 to about 0.3 seconds and then purging the oxygen precursor to form a thickness of alumina; and
- repeating the introducing the aluminum precursor and purging and the introducing the oxygen precursor and purging until a desired thickness of alumina is achieved.

15. The method of claim 14, wherein the aluminum precursor is one of tri-methyl aluminum or aluminum chloride and the oxygen precursor is one of water, ozone, oxygen or hydrogen peroxide.

\* \* \* \* \*